(12) United States Patent
Dimaano, Jr. et al.

(10) Patent No.: US 7,936,055 B2
(45) Date of Patent: May 3, 2011

(54) INTEGRATED CIRCUIT PACKAGE SYSTEM WITH INTERLOCK

(75) Inventors: Antonio B. Dimaano, Jr., Singapore (SG); Pandi Chelvam Marimuthu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 349 days.

(21) Appl. No.: 11/466,748

(22) Filed: Aug. 23, 2006

(65) Prior Publication Data
US 2008/0054421 A1 Mar. 6, 2008

(51) Int. Cl.
*H01L 23/495* (2006.01)
*H01L 21/44* (2006.01)

(52) U.S. Cl. ............... 257/676; 257/E23.043; 438/123

(58) Field of Classification Search .............. 257/676, 257/667, E1.505, E23.004, E23.043–E23.05; 438/123
See application file for complete search history.

(56) References Cited

U.S. PATENT DOCUMENTS

| | | | |
|---|---|---|---|
| 6,118,174 A * | 9/2000 | Kim | 257/676 |
| 6,323,065 B1 | 11/2001 | Karnezos | |
| 6,348,729 B1 * | 2/2002 | Li et al. | 257/691 |
| 6,498,099 B1 * | 12/2002 | McLellan et al. | 438/689 |
| 6,545,347 B2 * | 4/2003 | McClellan | 257/690 |
| 6,642,609 B1 * | 11/2003 | Minamio et al. | 257/666 |
| 6,650,020 B2 * | 11/2003 | Yamada et al. | 257/783 |
| 6,812,552 B2 | 11/2004 | Islam et al. | |
| 6,818,973 B1 * | 11/2004 | Foster | 257/676 |
| 6,876,068 B1 * | 4/2005 | Lee et al. | 257/676 |
| 6,995,460 B1 | 2/2006 | McLellan et al. | |
| 7,009,286 B1 | 3/2006 | Kirloskar et al. | |
| 7,049,177 B1 * | 5/2006 | Fan et al. | 438/123 |
| 2001/0035569 A1 * | 11/2001 | Shibata | 257/667 |
| 2002/0084518 A1 * | 7/2002 | Hasebe et al. | 257/676 |
| 2003/0015775 A1 * | 1/2003 | Minamio et al. | 257/676 |
| 2004/0104457 A1 * | 6/2004 | Tan et al. | 257/666 |
| 2004/0124508 A1 * | 7/2004 | Tan et al. | 257/675 |
| 2004/0227217 A1 * | 11/2004 | Jang | 257/676 |
| 2005/0236701 A1 * | 10/2005 | Minamio et al. | 257/676 |

* cited by examiner

*Primary Examiner* — Wael M Fahmy
*Assistant Examiner* — Sarah K Salerno
(74) *Attorney, Agent, or Firm* — Mikio Ishimaru

(57) ABSTRACT

An integrated circuit package system is provided including forming a first external interconnect and a die paddle having a slot, forming an inner terminal from a peripheral region of the die paddle, connecting an integrated circuit die and the peripheral region for ground connection, and molding through the slot.

20 Claims, 6 Drawing Sheets

INTEGRATED CIRCUIT PACKAGE SYSTEM WITH INTERLOCK

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions.

Integrated circuit packages for complex electronic systems typically have a large number of interconnected integrated circuit chips. The integrated circuit chips are usually made from a semiconductor material such as silicon. After manufacture, the chips are typically incorporated into packages that are then mounted on printed circuit wiring boards.

Integrated circuit chip packages typically have numerous external pins that are mechanically attached by solder or a variety of other known techniques to conductor patterns on the printed circuit wiring boards.

Typically, the packages in which these integrated circuit semiconductor chips are mounted include a substrate or other chip mounting device. One example of such a substrate is a lead frame. More particularly, a lead frame is a metal frame that includes a centrally located die paddle or die pad and a plurality of peripherally-located leads that surround the die pad. The die pad mounts the semiconductor chip (or "die"). Power, ground, and/or signal leads of the lead frame are connected electrically by wire bonds to power, ground, and/or signal sites on the chip and serve as external connecting means for the chip.

After the chip is wire-bonded to the leads, the chip, the die pad, and portions of the leads are encapsulated in a plastic, an epoxy-molded compound, or a multi-part housing made of plastic, ceramic, or metal, to form the semiconductor package. The package protects the lead frame and the chip from physical, electrical, moisture, and/or chemical damage.

Some lead frame configurations, for example exposed die pad packages, include a separate ground ring structure that is supported around the periphery of the die pad and inside the inner ends of the leads. The ground ring facilitates the many bonding wire electrical connections that typically must be made to connect ground pads on the die to electrical ground connections on the lead frame.

Typically, the ground ring is coated with a metal, such as silver, to improve bonding adhesion between the wires and the ground ring. However, silver forms a weak adhesion with the encapsulation material. This may provide problems causing separation between the integrated circuit die from the die pad.

Integrated circuit packages, such as quad flat no-leaded (QFN) packages, surface mount for die attach paddle (DAP) are an option, which depend on application requirements. If DAP will be mounted, space beneath the DAP will not be available for routing, which in turn can result in increasing board size and/or reduced electrical performance. Conversely, some QFN package applications requiring thermal and electrical performance are being limited due to DAP not being mounted onto the printed circuit board.

Looking at other assembly aspects, wire bonding for QFN packages is becoming a challenge. I/O pitch continues to decrease in order to increase I/O density. The reduced I/O pitch also exacerbates flow of the molding compound at the I/O area leading to increased potential for molding compound delamination, especially with the silver on the ground ring. Down bonds are used for grounding application which in turn decreases the number of I/O available for signals. Higher moisture sensitivity level (MSL) requirements are also being sought for QFN packages due to its body size.

Thus, a need still remains for an integrated circuit package system providing low cost manufacturing, reduced form factor, and improved reliability for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a first external interconnect and a die paddle having a slot, forming an inner terminal from a peripheral region of the die paddle, connecting an integrated circuit die and the peripheral region for ground connection, and molding through the slot.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
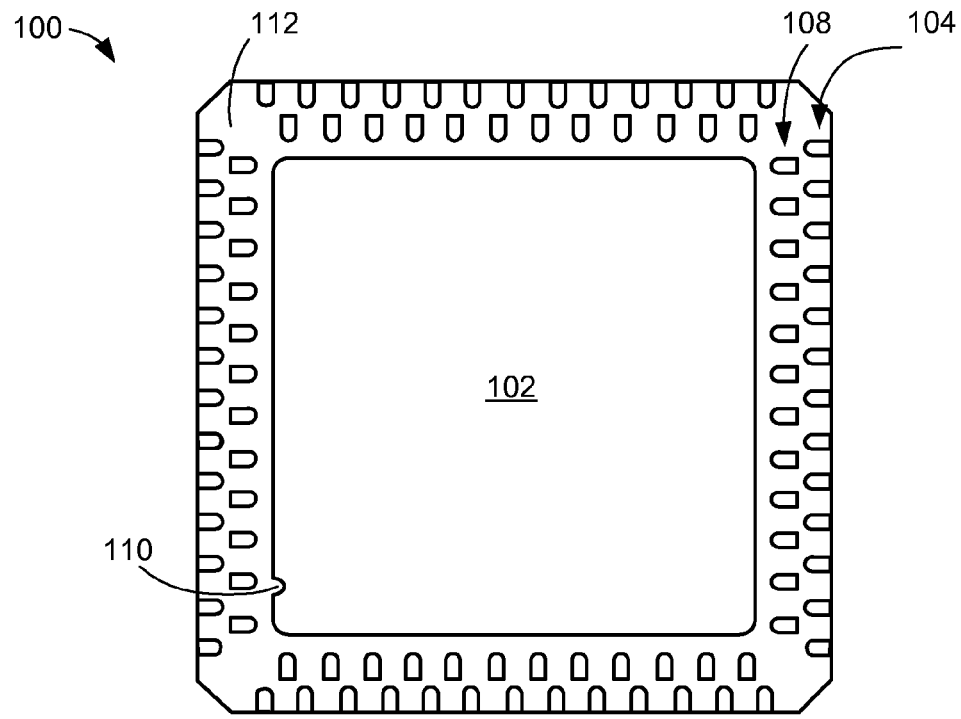
FIG. 1 is a bottom view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a bottom view of an integrated circuit package system 100 in an embodiment of the present invention. The integrated circuit package system 100 includes a die paddle 102. The die paddle 102 is within a dual row of terminals pads with an outer row having outer terminals 104 and an inner row having inner terminals 108. The outer terminals 104 and the inner terminals 108 are in a staggered configuration.

To be described in more details later, the inner terminals 108 allow for ground connections to the die paddle 102 from the next system level (not shown), such as a printed circuit board or another package. The inner terminals 108 provide additional flexibility for ground traces (not shown) of a printed circuit board (not shown) to provide ground connection to the integrated circuit package system 100 reducing the routing congestion of the printed circuit board. The additional routing flexibility alleviates the need to use a larger pin count, larger footprint package allowing the integrated circuit package system 100 to be as small a footprint as possible. The inner terminals 108 allow the printed circuit board, below the die paddle 102, to have routing or traces.

The die paddle 102 may also serve multiple functions, such as an electromagnetic interference (EMI) shield or a heat spreader. The inner terminals 108 tied to ground enable maximum use of the outer terminals 104 for non-ground functions resulting in a smaller package footprint. The die paddle 102 has a recess 110 that may be used to identify pin 1 location of the integrated circuit package system 100.

An encapsulation 112, such as a cover of an epoxy mold compound (EMC), surrounds the die paddle 102, the recess 110, the outer terminals 104, and the inner terminals 108. The outer terminals 104 and the inner terminals 108 are exposed for connections to the next system level. The die paddle 102 may be exposed for connection to the next system level.

Figure 2:
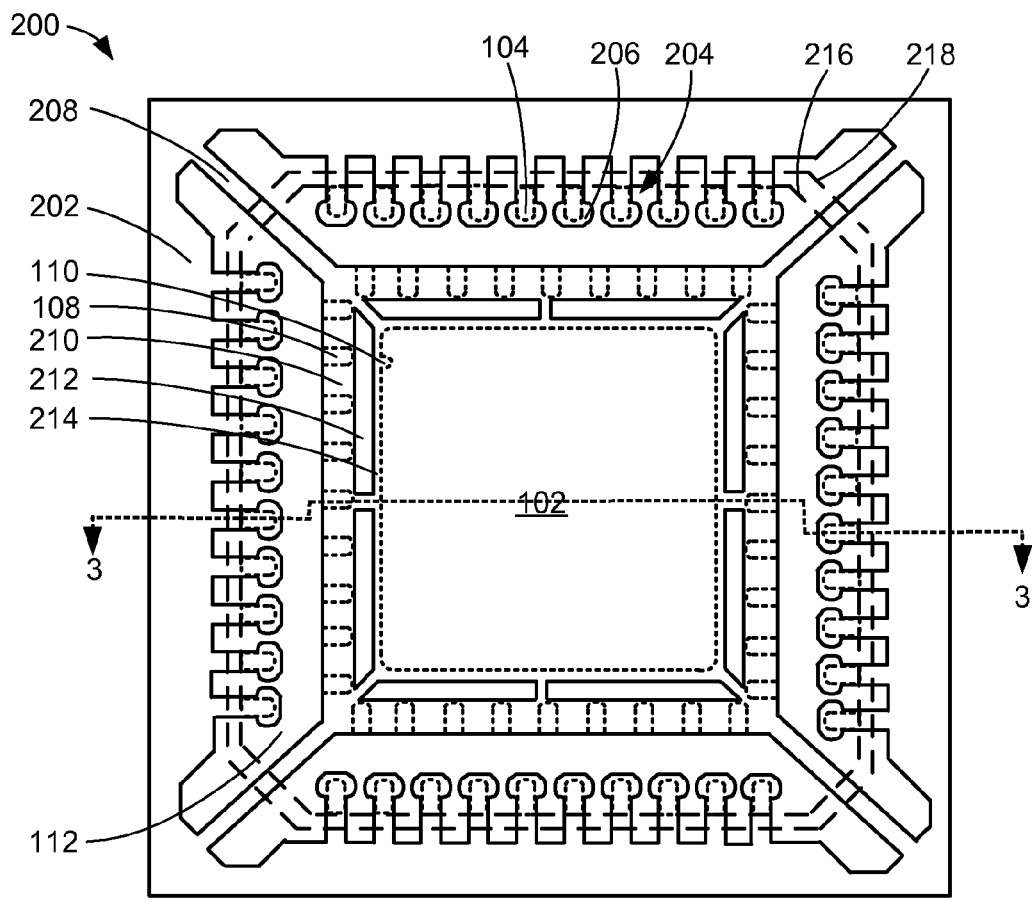
FIG. 2 is a plan view of a lead frame having the integrated circuit package system of FIG. 1.

Referring now to FIG. 2, therein is shown a plan view a lead frame 200 having the integrated circuit package system 100 of FIG. 1. The lead frame 200 has dam bars 202 providing support to terminal fingers 204. The terminal fingers 204 have the outer terminals 104 and finger ends 206. The lead frame 200 also has tie bars 208 connecting to the die paddle 102.

The inner terminals 108 are formed at a peripheral region 210 of the die paddle 102 by removal of portions from a bottom surface of the peripheral region of 210 separated from the die paddle 102 by slots 212, whereby the inner terminals 108 extend or protrude from recessed portions of a bottom surface of the peripheral region 210. The inner terminals 108 tied to ground forms a ground ring with the peripheral region 210 and the die paddle 102 is also grounded forming a ground shield, such as an electromagnetic interference (EMI) shield.

The slots 212 are formed in the die paddle 102 outlining the peripheral region 210. The slots 212 may be formed by a number of processes, such as combination of etching and half etching or stamping. A mold compound of the encapsulation 112 flows through the slots 212 adjacent to the inner terminals 108 and under the peripheral region 210. The peripheral region 210, the slots 212, and the rest of the die paddle 102 form part of a mold interlock of the integrated circuit package system 100. The finger ends 206 and the tie bars 208 also form part of the mold interlock.

An outline of a paddle bottom surface 214 along with the recess 110 is shown as a dotted line. The outer terminals 104 may potentially used for non-ground or signal applications, reducing the need to increase the length and width of the integrated circuit package system 100. An outline of edges 216 of the integrated circuit package system 100 is also shown. A singulation outline 218 is shown to singulate the lead frame 200 at the appropriate time to form the integrated circuit package system 100. The singulation process may by a number of processes, such as punch or saw singulation.

Figure 3:
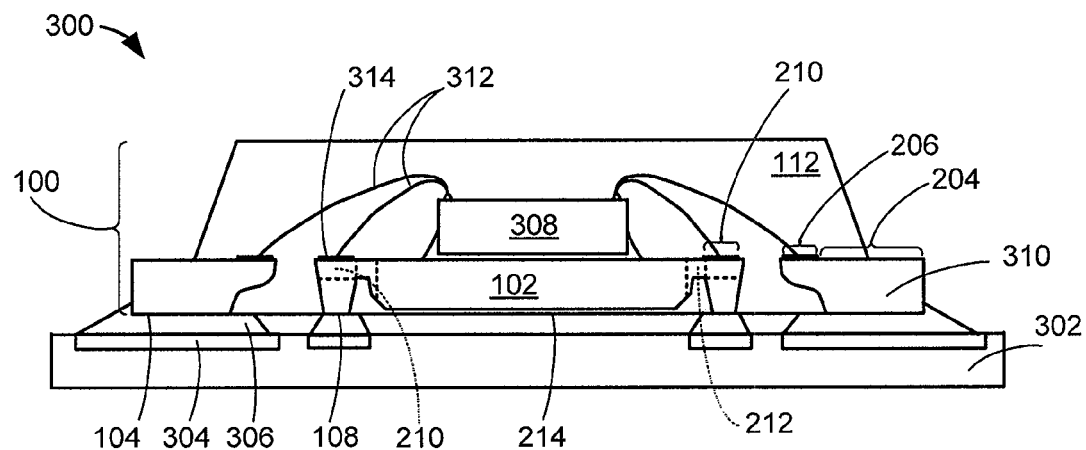
FIG. 3 is a cross-sectional view of an electronic system having the integrated circuit package system of FIG. 1.

Referring now to FIG. 3, therein is shown a cross-sectional view of an electronic system 300 having the integrated circuit package system 100 of FIG. 1. The electronic system 300 may be a hand held appliance, such as a cellular phone, digital camera, or location based service device; an enterprise class appliance, such as storage array, compute server, or network router; or other everyday product having integrated circuits, such as a television, automobile, or refrigerator.

The electronic system 300 has the integrated circuit package system 100 mounted on a substrate 302, such as a printed circuit board. The substrate 302 has contacts 304, such signal contacts and ground contacts. The outer terminals 104 connect to the contacts 304 in a predetermined pattern with a connector 306, such as solder. The inner terminals 108 also connect to the contacts 304, such as ground contacts, in a predetermined pattern with the connector 306.

The substrate 302 below the paddle bottom surface 214 is not required to provide the contacts 304 to the integrated circuit package system 100. This space has the flexibility to be used a number of functions, such as routing traces, void of any routing, or may be used as a heat sink for the integrated circuit package system 100.

The cross-sectional view of the integrated circuit package system 100 is along segment lines 3-3 of FIG. 2. An integrated circuit die 308 is attached to the die paddle 102 with an adhesive. The die paddle 102 has the peripheral region 210 with the inner terminals 108 and the paddle bottom surface 214 at the bottom.

External interconnects 310, such as terminals, are formed from the terminal fingers 204 of FIG. 2 and has the outer terminals 104 at the bottom. The finger ends 206 of the external interconnects 310 may be formed by a number of processes, such as half etching or stamping. Internal interconnects 312, such as bond wires, connect between the integrated circuit die 308 and a plating 314, such as a silver plating, on the peripheral region 210. The internal interconnects 312 also connect between the integrated circuit die 308 and the finger ends 206.

The encapsulation 112 covers the integrated circuit die 308 and the internal interconnects 312. The encapsulation 112 also partially covers the external interconnects 310 exposing the outer terminals 104 and the die paddle 102 exposing the inner terminals 108 as well as the paddle bottom surface 214. The mold interlocks help prevent separation of the encapsulation 112 and the plating 314.

Figure 4:
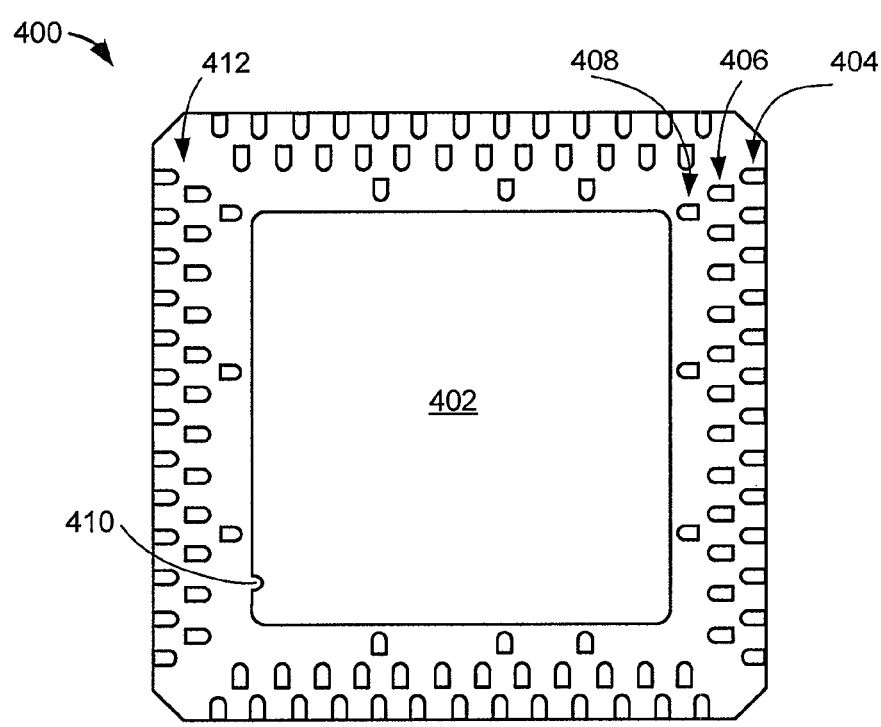
FIG. 4 is a bottom view of an integrated circuit package system in an alternative embodiment of the present invention.

Referring now to FIG. 4, therein is shown a bottom view of an integrated circuit package system 400 in an alternative embodiment of the present invention. The integrated circuit package system 400 includes a die paddle 402. The die paddle 402 is within a tri-row of terminals pads with an outer row having outer terminals 404, a middle row having middle terminals 406, and an inner row having inner terminals 408. The outer terminals 404, the middle terminals 406, and the inner terminals 408 are in a staggered configuration.

To be described in more details later, the inner terminals 408 allow for ground connections to the die paddle 402 from the next system level (not shown), such as a printed circuit board or another package. The inner terminals 408 provide additional flexibility for ground traces (not shown) of a printed circuit board (not shown) to provide ground connection to the integrated circuit package system 400 reducing the routing congestion of the printed circuit board. The additional routing flexibility alleviates the need to use a larger pin count, larger footprint package allowing the integrated circuit package system 400 to be as small a footprint as possible. The inner terminals 408 allow the printed circuit board, below the die paddle 402, to have routing or traces.

The die paddle 402 may also serve multiple functions, such as an electromagnetic interference (EMI) shield or a heat spreader. The inner terminals 408 tied to ground enable maximum use of the outer terminals 404 and the middle terminals 406 for non-ground functions resulting in a smaller package footprint. The die paddle 402 has a recess 410 that may be used to identify pin 1 location of the integrated circuit package system 400.

An encapsulation 412, such as a cover of an epoxy mold compound (EMC), surrounds the die paddle 402, the recess 410, the outer terminals 404, the middle terminals 406, and the inner terminals 408. The outer terminals 404, the middle terminals 406, and the inner terminals 408 are exposed for connections to the next system level. The die paddle 402 may be exposed for connection to the next system level.

Figure 5:
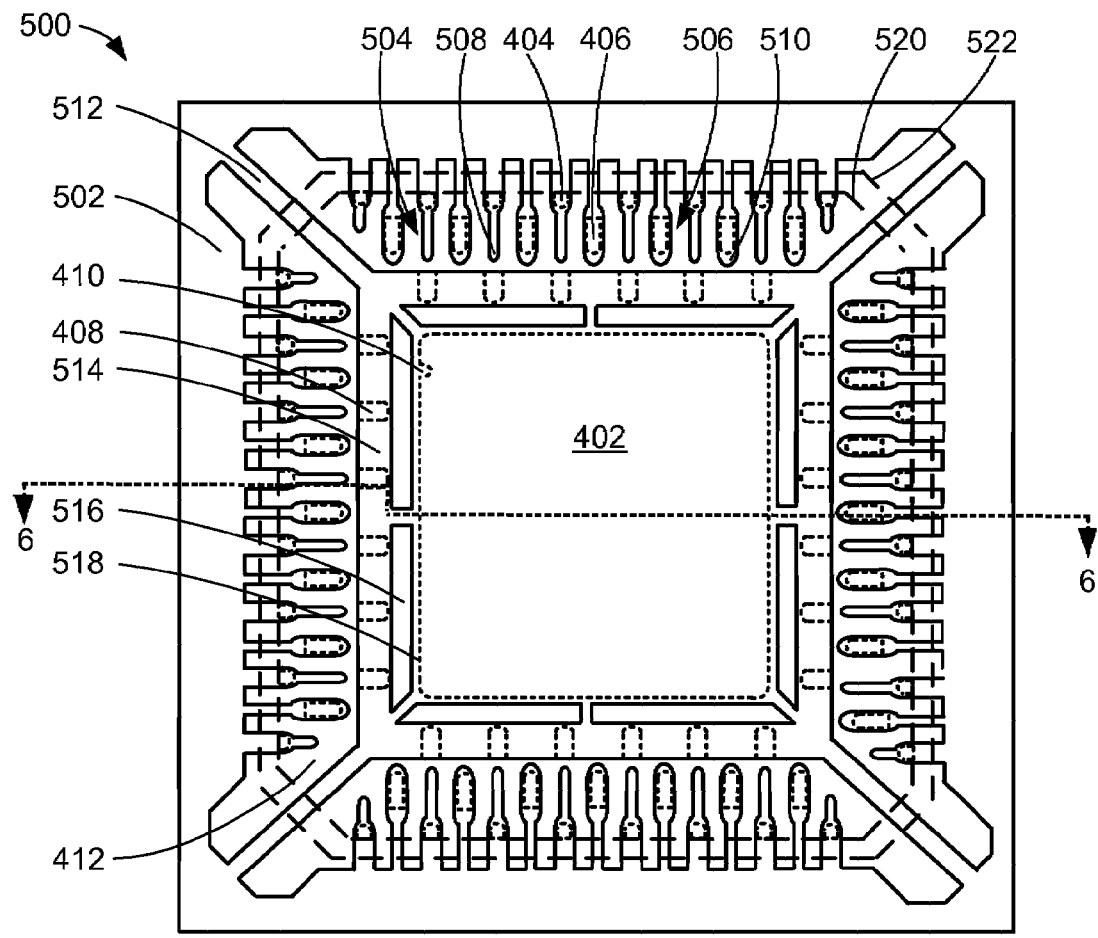
FIG. 5 is a plan view of a lead frame having the integrated circuit package system of FIG. 4.

Referring now to FIG. 5, therein is shown a plan view of a lead frame 500 having the integrated circuit package system 400 of FIG. 4. The lead frame 500 has dam bars 502 providing support to first terminal fingers 504 and second terminal fingers 506. The first terminal fingers 504 have the outer terminals 404 and first finger ends 508. The second terminal fingers 506 have the middle terminals 406 and second finger ends 510.

The widths of the outer terminals 404 are approximately the widths of the middle terminals 406. The widths of the first finger ends 508 are approximately the widths of the second terminal fingers 506 that is not part of the second finger ends 510. These complementary widths between adjacent instances of the first terminal fingers 504 and the second terminal fingers 506 allow for a higher density of the outer terminals 404 as well as the middle terminals 406. The lead frame 500 also has tie bars 512 connecting to the die paddle 402.

The inner terminals 408 are at a peripheral region 514 of the die paddle 402. The inner terminals 408 tied to ground forms a ground ring with the peripheral region 514 and the die paddle 402 is also grounded forming a ground shield, such as an electromagnetic interference (EMI) shield.

Slots 516 are formed in the die paddle 402 outlining the peripheral region 514. The slots 516 may be formed by a number of processes, such as combination of etching and half etching or stamping. A mold compound of the encapsulation 412 flows through the slots 516. The peripheral region 514, the slots 516, and the rest of the die paddle 402 form part of a mold interlock of the integrated circuit package system 400. The first finger ends 508, the second finger ends 510, and the tie bars 512 also form part of the mold interlock.

An outline of a paddle bottom surface 518 along with the recess 410 is shown as a dotted line. The outer terminals 404 may potentially used for non-ground or signal applications, reducing the need to increase the length and width of the integrated circuit package system 400. An outline of edges 520 of the integrated circuit package system 400 is also shown. A singulation outline 522 is shown to singulate the lead frame 500 at the appropriate time to form the integrated circuit package system 400. The singulation process may by a number of processes, such as punch or saw singulation.

Figure 6:
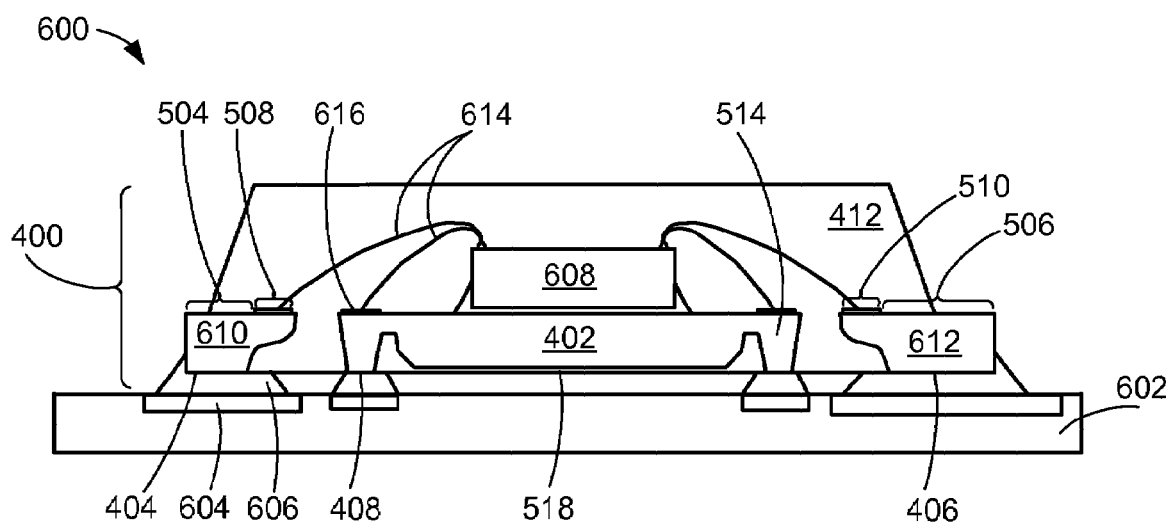
FIG. 6 is a cross-sectional view of an electronic system having the integrated circuit package system of FIG. 4.

Referring now to FIG. 6, therein is shown a cross-sectional view of an electronic system 600 having the integrated circuit package system of FIG. 4. The electronic system 600 may be a hand held appliance, such as a cellular phone, digital camera, or location based service device; an enterprise class appliance, such as storage array, compute server, or network router; or other everyday product having integrated circuits, such as a television, automobile, or refrigerator.

The electronic system 600 has the integrated circuit package system 400 mounted on a substrate 602, such as a printed circuit board. The substrate 602 has contacts 604, such signal contacts and ground contacts. The outer terminals 404 and the middle terminals 406 connect to the contacts 604 in a predetermined pattern with a connector 606, such as solder. The inner terminals 408 also connect to the contacts 604, such as ground contacts, in a predetermined pattern with the connector 606.

The substrate 602 below the paddle bottom surface 518 is not required to provide the contacts 604 to the integrated circuit package system 400. This space has the flexibility to be used a number of functions, such as routing traces, void of any routing, or may be used as a heat sink for the integrated circuit package system 400.

The cross-sectional view of the integrated circuit package system 400 is along segment lines 6-6 of FIG. 5. An integrated circuit die 608 is attached to the die paddle 402 with an adhesive. The die paddle 402 has the peripheral region 514 with the inner terminals 408 and the paddle bottom surface 518 at the bottom.

First external interconnects 610, such as terminals, are formed from the first terminal fingers 504 of FIG. 5 and have the outer terminals 404 at the bottom. Second external interconnects 612, such as terminals, are formed from the second terminal fingers 506 of FIG. 5 and have the middle terminals 406 at the bottom. The first finger ends 508 of the first external interconnects 610 and the second finger ends 510 of the second external interconnects 612 may be formed by a number of processes, such as half etching or stamping. Internal interconnects 614, such as bond wires, connect between the integrated circuit die 608 and a plating 616, such as a silver plating, on the peripheral region 514. The internal interconnects 614 also connect between the integrated circuit die 608 and the first finger ends 508 as well as the second finger ends 510.

The encapsulation 412 covers the integrated circuit die 608 and the internal interconnects 614. The encapsulation 412 also partially covers the first external interconnects 610 exposing the outer terminals 404, the second external interconnects 612 exposing the middle terminals 406, and the die paddle 402 exposing the inner terminals 408 as well as the paddle bottom surface 518. The mold interlocks help prevent separation of the encapsulation 412 and the plating 616.

Figure 7:
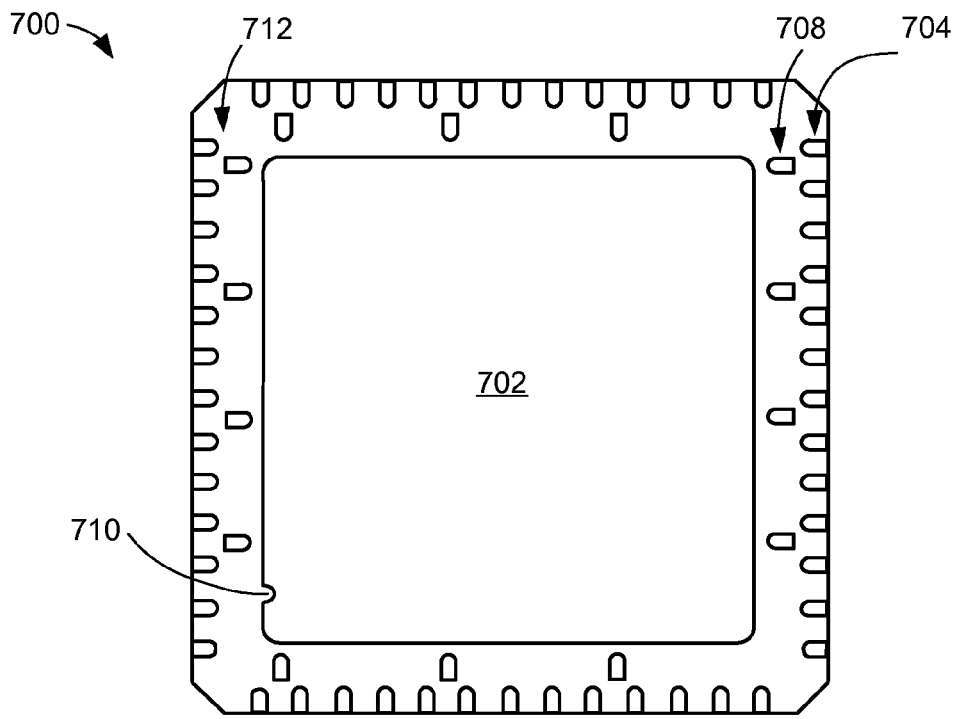
FIG. 7 is a bottom view of an integrated circuit package system in another alternative embodiment of the present invention.

Referring now to FIG. 7, therein is shown a bottom view of an integrated circuit package system 700 in another alternative embodiment of the present invention. The integrated circuit package system 700 includes a die paddle 702. The die paddle 702 is within a dual row of terminals pads with an outer row having outer terminals 704 and an inner row having inner terminals 708. The outer terminals 704 and the inner terminals 708 are in a staggered configuration. The spacing between the inner terminals 708 is greater than the spacing between the outer terminals 704.

The inner terminals 708 allow for ground connections to the die paddle 702 from the next system level (not shown), such as a printed circuit board or another package. The inner terminals 708 provide additional flexibility for ground traces (not shown) of a printed circuit board (not shown) to provide ground connection to the integrated circuit package system 700 reducing the routing congestion of the printed circuit board. The additional routing flexibility alleviates the need to use a larger pin count, larger footprint package allowing the integrated circuit package system 700 to be as small a footprint as possible. The inner terminals 708 allow the printed circuit board, below the die paddle 702, to have routing or traces.

The die paddle 702 may also serve multiple functions, such as an electromagnetic interference (EMI) shield or a heat spreader. The inner terminals 708 tied to ground enable maximum use of the outer terminals 704 for non-ground functions resulting in a smaller package footprint. The die paddle 702 has a recess 710 that may be used to identify pin 1 location of the integrated circuit package system 700.

An encapsulation 712, such as a cover of an epoxy mold compound (EMC), surrounds the die paddle 702, the recess 710, the outer terminals 704, and the inner terminals 708. The outer terminals 704 and the inner terminals 708 are exposed for connections to the next system level. The die paddle 702 may be exposed for connection to the next system level.

Figure 8:
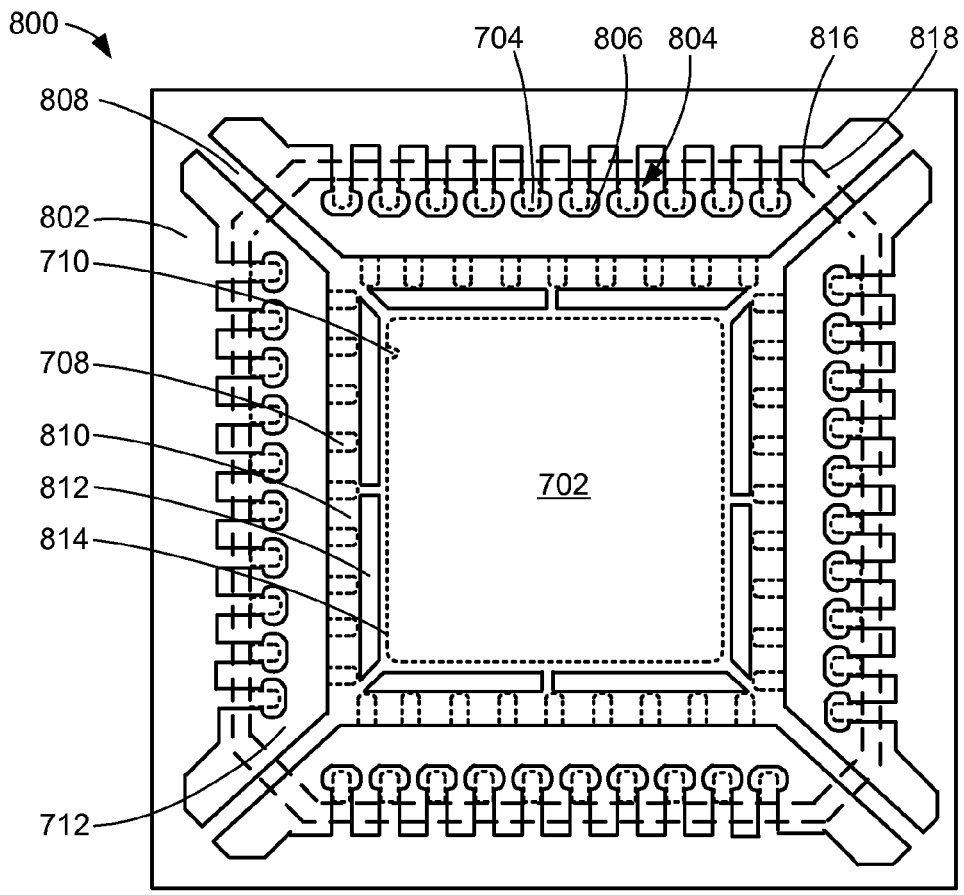
FIG. 8 is a plan view of a lead frame having the integrated circuit package system of FIG. 7.

Referring now to FIG. 8, therein is shown a plan view of a lead frame 800 having the integrated circuit package system 700 of FIG. 7. The lead frame 800 has dam bars 802 providing support to terminal fingers 804. The terminal fingers 804 have the outer terminals 704 and finger ends 806. The lead frame 800 also has tie bars 808 connecting to the die paddle 702.

The inner terminals 708 are at a peripheral region 810 of the die paddle 702. The inner terminals 708 tied to ground forms a ground ring with the peripheral region 810 and the die paddle 702 is also grounded forming a ground shield, such as an electromagnetic interference (EMI) shield.

Slots 812 are formed in the die paddle 702 outlining the peripheral region 810. The slots 812 may be formed by a number of processes, such as combination of etching and half etching or stamping. A mold compound of the encapsulation 712 flows through the slots 812. The peripheral region 810, the slots 812, and the rest of the die paddle 702 form part of a mold interlock of the integrated circuit package system 700. The finger ends 806 and the tie bars 808 also form part of the mold interlock.

An outline of a paddle bottom surface 814 along with the recess 710 is shown as a dotted line. The outer terminals 704 may potentially used for non-ground or signal applications, reducing the need to increase the length and width of the integrated circuit package system 700. An outline of edges 816 of the integrated circuit package system 700 is also shown. A singulation outline 818 is shown to singulate the lead frame 800 at the appropriate time to form the integrated circuit package system 700. The singulation process may by a number of processes, such as punch or saw singulation.

Figure 9:
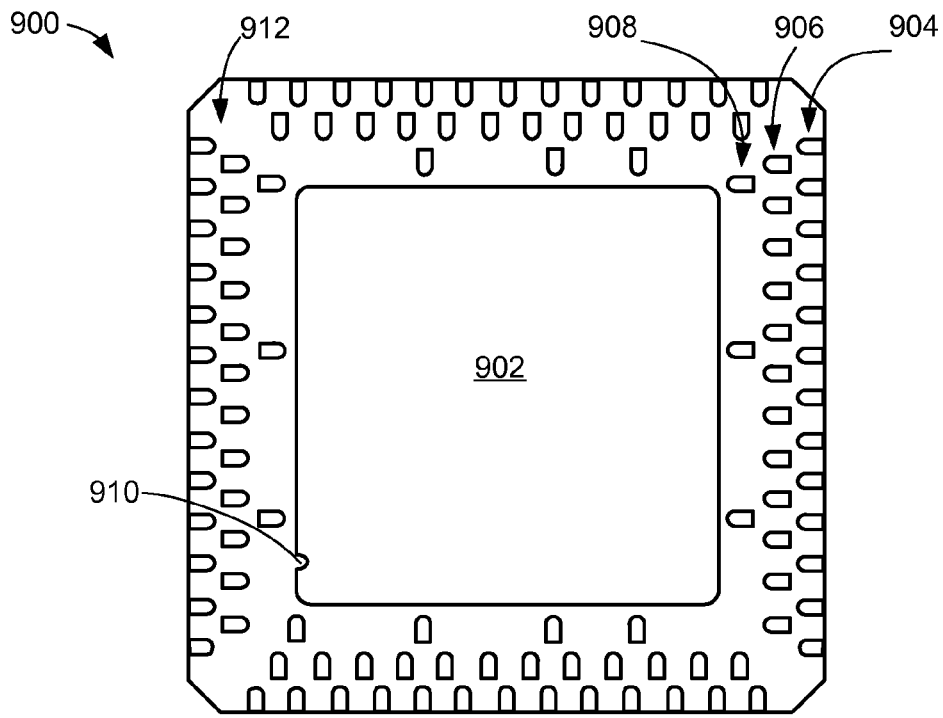
FIG. 9 is a bottom view of an integrated circuit package system in yet another alternative embodiment of the present invention.

Referring now to FIG. 9, therein is shown a bottom view of an integrated circuit package system 900 in yet another alternative embodiment of the present invention. The integrated circuit package system 900 includes a die paddle 902. The die paddle 902 is within a tri-row of terminals pads with an outer row having outer terminals 904, a middle row having middle terminals 906, and an inner row having inner terminals 908. The outer terminals 904, the middle terminals 906, and the inner terminals 908 are in a staggered configuration. The spacing between the inner terminals 908 is greater than the spacing between the outer terminals 904 and between the middle terminals 906.

To be described in more details later, the inner terminals 908 allow for ground connections to the die paddle 902 from the next system level (not shown), such as a printed circuit board or another package. The inner terminals 908 provide additional flexibility for ground traces (not shown) of a printed circuit board (not shown) to provide ground connection to the integrated circuit package system 900 reducing the routing congestion of the printed circuit board. The additional routing flexibility alleviates the need to use a larger pin count, larger footprint package allowing the integrated circuit package system 900 to be as small a footprint as possible. The inner terminals 908 allow the printed circuit board, below the die paddle 902, to have routing or traces.

The die paddle 902 may also serve multiple functions, such as an electromagnetic interference (EMI) shield or a heat spreader. The inner terminals 908 tied to ground enable maximum use of the outer terminals 904 and the middle terminals 906 for non-ground functions resulting in a smaller package footprint. The die paddle 902 has a recess 910 that may be used to identify pin 1 location of the integrated circuit package system 900.

An encapsulation 912, such as a cover of an epoxy mold compound (EMC), surrounds the die paddle 902, the recess 910, the outer terminals 904, the middle terminals 906, and the inner terminals 908. The outer terminals 904, the middle terminals 906, and the inner terminals 908 are exposed for connections to the next system level. The die paddle 902 may be exposed for connection to the next system level.

Figure 10:
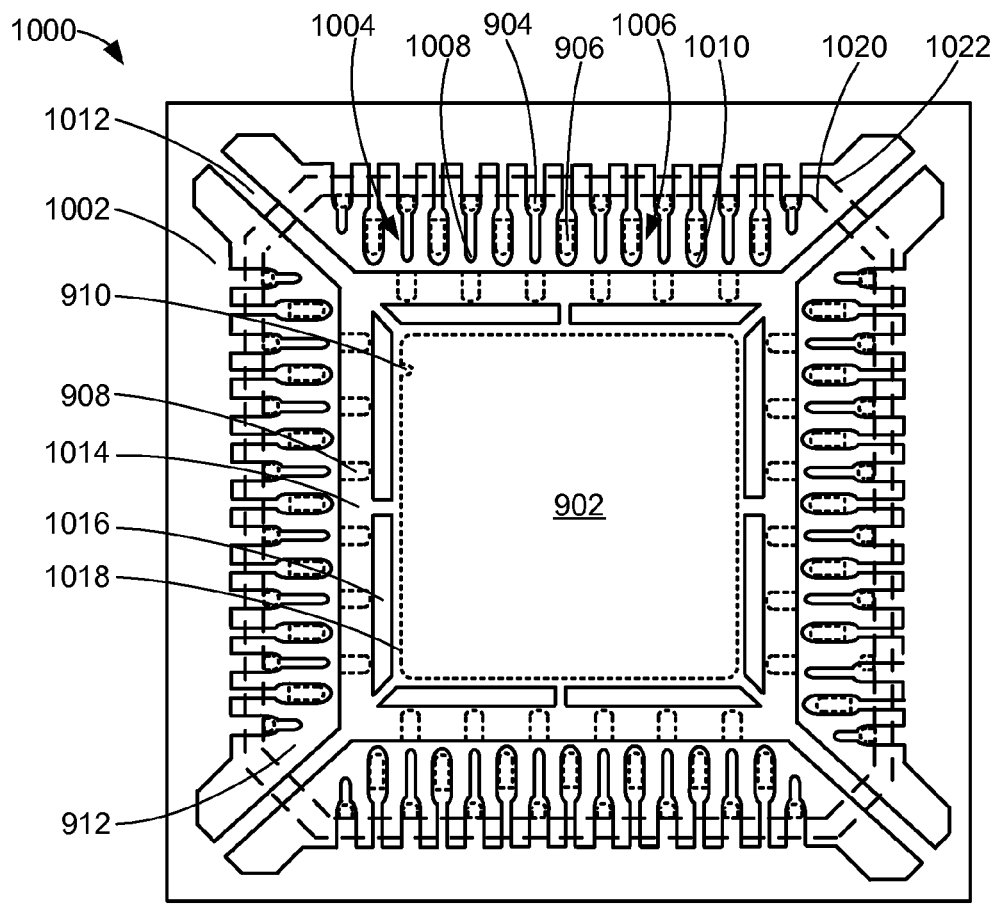
FIG. 10 is a plan view of a lead frame having the integrated circuit package system of FIG. 9.

Referring now to FIG. 10, therein is shown a plan view of a lead frame 1000 having the integrated circuit package system 900 of FIG. 9. The lead frame 1000 has dam bars 1002 providing support to first terminal fingers 1004 and second terminal fingers 1006. The first terminal fingers 1004 have the outer terminals 904 and first finger ends 1008. The second terminal fingers 1006 have the middle terminals 906 and second finger ends 1010.

The widths of the outer terminals 904 are approximately the widths of the middle terminals 906. The widths of the first finger ends 1008 are approximately the widths of the second terminal fingers 1006 that is not part of the second finger ends 1010. These complementary widths between adjacent instances of the first terminal fingers 1004 and the second terminal fingers 1006 allow for a higher density of the outer terminals 904 as well as the middle terminals 906. The lead frame 1000 also has tie bars 1012 connecting to the die paddle 902.

The inner terminals 908 are at a peripheral region 1014 of the die paddle 902. The inner terminals 908 tied to ground forms a ground ring with the peripheral region 1014 and the die paddle 902 is also grounded forming a ground shield, such as an electromagnetic interference (EMI) shield.

Slots 1016 are formed in the die paddle 902 outlining the peripheral region 1014. The slots 1016 may be formed by a number of processes, such as combination of etching and half etching or stamping. A mold compound of the encapsulation 912 flows through the slots 1016. The peripheral region 1014, the slots 1016, and the rest of the die paddle 902 form part of a mold interlock of the integrated circuit package system 900. The first finger ends 1008, the second finger ends 1010, and the tie bars 1012 also form part of the mold interlock.

An outline of a paddle bottom surface 1018 along with the recess 910 is shown as a dotted line. The outer terminals 904 may potentially used for non-ground or signal applications, reducing the need to increase the length and width of the integrated circuit package system 900. An outline of edges 1020 of the integrated circuit package system 900 is also shown. A singulation outline 1022 is shown to singulate the lead frame 1000 at the appropriate time to form the integrated circuit package system 900. The singulation process may by a number of processes, such as punch or saw singulation.

Figure 11:
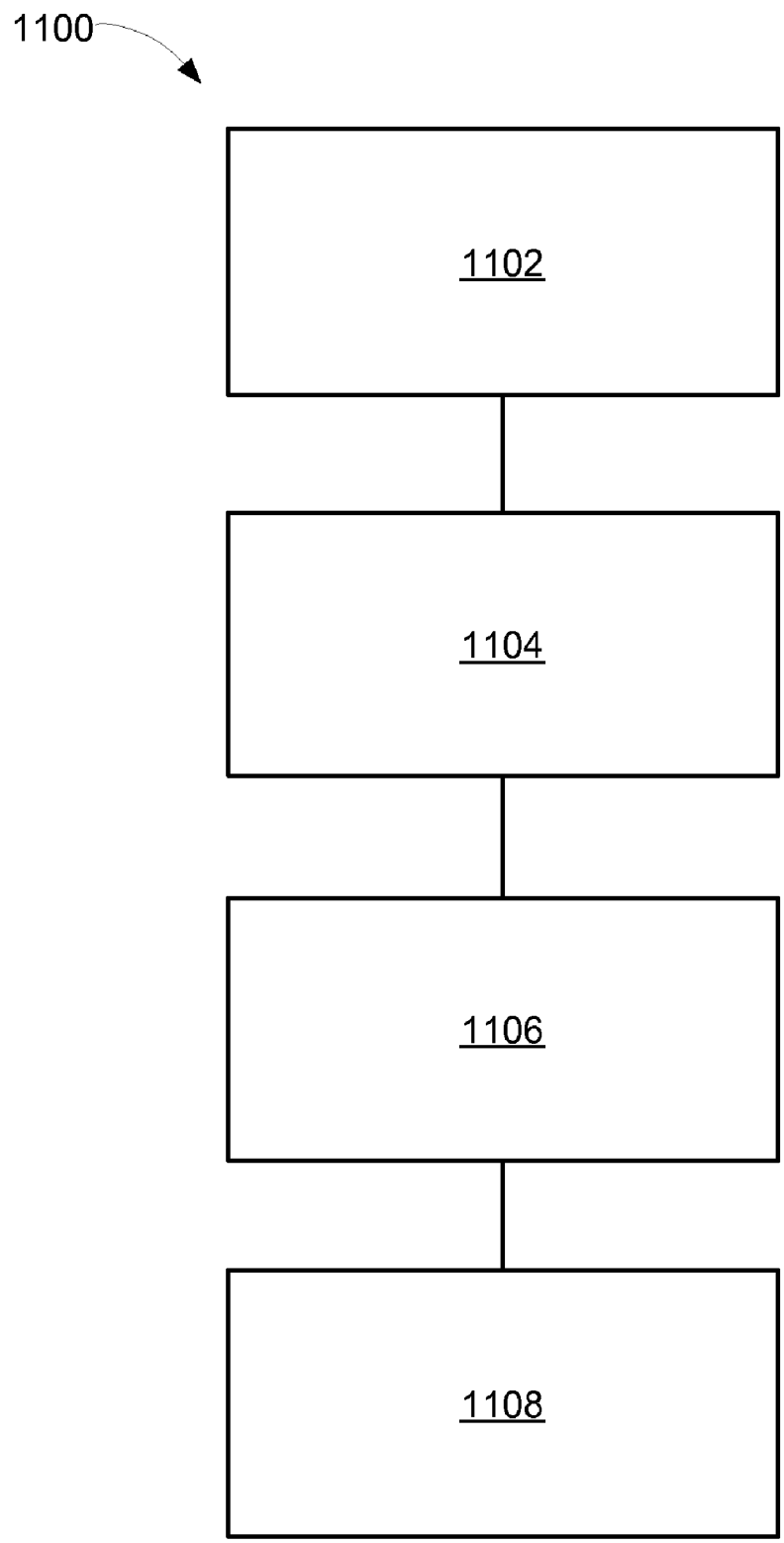
FIG. 11 is a flow chart of an integrated circuit package system for manufacture of the integrated circuit package system in an embodiment of the present invention.

Referring now to FIG. 11, therein is shown a flow chart of an integrated circuit package system 1100 for manufacture of the integrated circuit package system 100 in an embodiment of the present invention. The system 1100 includes forming a first external interconnect and a die paddle having a slot in a block 1102; forming an inner terminal from a peripheral region of the die paddle in a block 1104; connecting an integrated circuit die and the peripheral region for ground connection in a block 1106; and molding through the slot in a block 1108.

It has been discovered that the present invention thus has numerous aspects.

It has been discovered that the present invention provides a flexible routing and contact structure for an electronic system having the integrated circuit package system. The substrate of the electronic system below the die paddle is not constrained to providing a bulk contact for ground. That portion of the substrate may be left void or traces may be routed below the die paddle.

An aspect is that the present invention provides routing space improvement by preventing the whole die paddle to be attached on the printed circuit board. The space below the die paddle may be used for routing traces.

Another aspect of the present invention provides improved mold interlocking with silver (Ag) ring or plating which is a typical delamination problem for high moisture sensitivity level (MSL) requirement.

Another aspect of the present invention provides eliminates down bond connection to the ground ring of the die paddle, which introduces flexibility in wire bond layout. This simplifies the manufacturing process and increases yield.

Yet another aspect of the present invention provides improved electrical performance. The additional routing flexibility allows for more degrees of freedom to route signals to improve signal integrity.

Yet another aspect of the present invention provides increased signal I/O count and density. The ground requirements for the integrated circuit die may be provided by the ground ring alleviating requirements to use other terminals for ground and having a maximum number available for non-ground, such as signal, connections.

Yet another aspect of the present invention provides improved thermal performance. The inner terminals may connect to different layers in the substrate providing different heat sink than the optional connection of the bottom surface of the die paddle to the substrate.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
    forming a first external interconnect and a die paddle having a slot;
    forming inner terminals by removal of portions of a peripheral region so that the inner terminals extend from recessed portions of a bottom surface of the peripheral region and separated from the die paddle by the slot;
    connecting an integrated circuit die and the peripheral region for ground connection; and
    molding an encapsulation through the slot adjacent to the inner terminal and completely under the peripheral region including exposing the inner terminal through the encapsulation.

2. The method as claimed in claim 1 wherein:
    forming the first external interconnect has an outer terminal; and
    molding through the slot covers the integrated circuit die, the first external interconnect with the outer terminal exposed, and the die paddle with the inner terminal exposed.

3. The method as claimed in claim 1 wherein connecting the integrated circuit die includes connecting the integrated circuit die and the first external interconnect.

4. The method as claimed in claim 1 further comprising forming a second external interconnect, having a second finger end, adjacent to the first external interconnect having a first finger end, wherein the widths of the first finger end and the second finger end are complementary.

5. The method as claimed in claim 1 further comprising forming outer terminals having an outer separation between the outer terminals different from an inner separation between inner terminals.

6. A method of manufacturing an integrated circuit package system comprising:
forming a first external interconnect, a die paddle having a slot, and a tie bar connected to the die paddle;
forming an outer terminal from the first external interconnect;
forming inner terminals by removal of portions of a peripheral region so that the inner terminals extend from recessed portions of a bottom surface of the peripheral region and separated from the die paddle by the slot;
connecting an integrated circuit die and the peripheral region for ground connection; and
molding an encapsulation through the slot adjacent to the inner terminal and completely under the peripheral region with the outer terminal and the inner terminal exposed.

7. The method as claimed in claim 6 further comprising forming a plating on the peripheral region.

8. The method as claimed in claim 6 wherein the molding includes covering a first finger end of the first external interconnect and the tie bar.

9. The method as claimed in claim 6 wherein forming the die paddle includes forming an electromagnetic interference shield and a heat spreader.

10. The method as claimed in claim 6 further comprising forming an electronic system having the integrated circuit package system.

11. An integrated circuit package system comprising:
a first external interconnect;
a die paddle having a slot;
inner terminals extend from recessed portions of a bottom surface of a peripheral region separated from the die paddle by the slot;
an integrated circuit die;
an internal interconnect between the integrated circuit die and the peripheral region for ground connection; and
an encapsulation through the slot adjacent to the inner terminal and completely under the peripheral region includes the inner terminals exposed from the encapsulation.

12. The system as claimed in claim 11 wherein:
the first external interconnect has an outer terminal; and
the encapsulation through the slot is a cover for the integrated circuit die, the first external interconnect with the outer terminal exposed, and the die paddle with the inner terminal exposed.

13. The system as claimed in claim 11 further comprising a second internal interconnect between the integrated circuit die and the first external interconnect.

14. The system as claimed in claim 11 further comprising a second external interconnect, having a second finger end, adjacent to the first external interconnect having a first finger end, wherein the widths of the first finger end and the second finger end are complementary.

15. The system as claimed in claim 11 further comprising outer terminals having an outer separation between the outer terminals different from an inner separation between inner terminals.

16. The system as claimed in claim 11 wherein:
the first external interconnect has an outer terminal;
the die paddle having the slot is connected to a tie bar;
the inner terminal of the peripheral region of the die paddle is for ground connection;
the integrated circuit die is over the die paddle;
the internal interconnect between the integrated circuit die and the peripheral region for ground connection is a bond wire; and
the encapsulation through the slot has the outer terminal and the inner terminal exposed.

17. The system as claimed in claim 16 further comprising a plating on the peripheral region.

18. The system as claimed in claim 16 wherein the encapsulation is a cover for a first finger end of the first external interconnect and the tie bar.

19. The system as claimed in claim 16 wherein the die paddle is an electromagnetic interference shield and a heat spreader.

20. The system as claimed in claim 16 further comprising an electronic system having the integrated circuit package system.

* * * * *